METALLIC CONTACTS FOR SEMICONDUCTOR DEVICES

Filed June 22, 1965 2 Sheets-Sheet 1

INVENTOR.
ELEFTHERIOS G. ATHANASSIADIS
BY
Attorney

Sept. 3, 1968 E. G. ATHANASSIADIS 3,400,308

METALLIC CONTACTS FOR SEMICONDUCTOR DEVICES

Filed June 22, 1965 2 Sheets-Sheet 2

INVENTOR.
ELEFTHERIOS G. ATHANASSIADIS
BY
Glenn H. Bruestle
Attorney

United States Patent Office 3,400,308
Patented Sept. 3, 1968

3,400,308
METALLIC CONTACTS FOR SEMICONDUCTOR DEVICES

Eleftherios G. Athanassiadis, Lebanon, N.J., assignor to Radio Corporation of America, a corporation of Delaware Filed June 22, 1965, Ser. No. 466,032
2 Claims. (Cl. 317—234)

ABSTRACT OF THE DISCLOSURE

Disclosed is a metal contact for semiconductor devices having a first layer of nickel or cobalt in contact with a surface of a semiconductor body and a layer of aluminum overlying the first metallic layer.

This invention relates to improved semiconductor devices, and to improved methods of fabricating improved metallic contacts on semiconductor devices.

In the manufacture of semiconductor devices such as diodes, triodes, tetrodes, and the like, comprising crystalline wafers of semiconductive materials which include PN junctions, or regions of different conductivity, it is generally necessary to make an electrical connection to a semiconductive body or wafer. The wafer may consist of silicon, silicon-germanium alloys, germanium, or the like. Since it is difficult to bond a metallic electrical lead wire directly to a semiconductive wafer, it has been the usual practice to deposit a metallic mass or layer on at least a portion of the wafer, alloy this metallic mass to the wafer, and then bond the electrical lead wire to the metallic mass. The metallic mass may consist of a pure metal such as aluminum, gold, or the like. Alternatively, the metallic mass which serves as the device electrode may consist of a mixture, or alloy, of several metals, such as chromium and silver, and may include a substance which is a conductivity modifier or doping agent in the particular semiconductor.

Various methods have been employed to make the metallic electrodes on semiconductor devices. When the semiconductor body or wafer utilized consists of silicon, a thin layer of a metal such as aluminum has been deposited, for example by evaporation, over the desired surface of the semiconductor. Standard photolithographic methods known to the art are then utilized to remove the undesired portions of this metal layer. The semiconductor body is next heated to a temperature sufficiently high to alloy the remaining portions of the metal layer to the semiconductor. Although satisfactory bipolar devices have been fabricated in this manner, the alloying of metallic contacts to silicon bodies introduces certain difficulties in the fabrication of some types of field-effect devices, such as a tendency of these devices to deteriorate when stored at elevated temperatures.

Accordingly, it is an object of this invention to provide an improved method of fabricating improved semiconductor devices.

Another object of the invention is to provide an improved method of fabricating improved electrical connections to semiconductive bodies.

Still another object is to provide improved metallic electrodes on semiconductive bodies.

These and other objects of the invention are accomplished by first depositing a layer of nickel or cobalt on at least a portion of the surface of a semiconductor body. A coating of a metal such as aluminum or the like is then deposited on the metal layer. The electrode thus formed consists of two distinct layers, and has been found particularly advantageous as an ohmic contact for certain field-effect devices. The electrical parameters of the field-effect devices thus fabricated are stable even when they are stored at elevated temperatures.

The invention will be described in greater detail by the following examples, considered in conjunction with the accompanying drawing, in which.

EXAMPLE I

Figure 1:
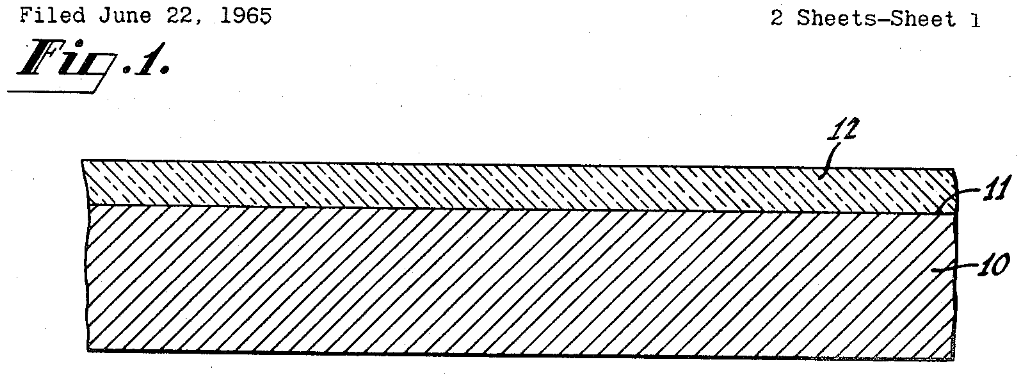
FIGURES 1–5 are cross-sectional views of a portion of a semiconductive body during successive steps in the fabrication of one embodiment of the improved semiconductor device.

A crystalline semiconductive body or wafer 10 (FIGURE 1) is prepared with at least one major face 11. The exact size, shape and conductivity of semiconductive body 10 is not critical. Conveniently, the semiconductive body is a transverse slice of a semiconductive ingot, and is large enough so that many units may be fabricated simultaneously. In the drawing, only a small portion of the entire semiconductive wafer 10 is shown. In this example, the semiconductive wafer 10 consists of monocrystalline silicon, is about 6 mils thick, and is of P type conductivity. The resistivity of wafer 10 is preferably equal to or greater than 1 ohm-cm.

Two spaced low-resistivity regions of conductivity type opposite that of the wafer are formed by techniques known to the art, such as by diffusion of a conductivity modifier through a mask into selected portions of wafer face 11. When the semiconductive wafer 10 consists of silicon, as in this example, the diffusion mask may consist of a silicon oxide coating 12 formed on wafer face 11 by heating the wafer 10 in steam for about 30 minutes at about 1050° C. The silicon oxide coating 12 thus formed is about 2000 to 4000 Angstroms thick. The other faces of wafer 10 may be masked during this step, or may also be coated with an oxide coating, which is subsequently removed.

Using standard masking and etching techniques known to the art, a pair of spaced openings 13 and 14 (FIGURE 2) are formed in silicon oxide coating 12, thus exposing predetermined portions of wafer face 11. The exact size and shape of openings 13 and 14 are not critical. The openings may have regular shapes such as poloygons or circles, or may be irregular in shape. The openings 13 and 14 may be equal or unequal in area. Preferably the distance between them should be less than one mil. In this example, the openings 13 and 14 are each 10 mils long, 3 mils wide, and spaced 0.3 mil apart along their 10 mils length.

The openings or apertures 13 and 14 in silicon oxide coating 12 may be formed by coating an acid resist (not shown) such as paraffin wax or apiezon wax on predetermined portions of silicon oxide layer 12, then removing the uncoated portions of silicon oxide layer 12 with an etchant such as a hydrofluoric acid solution. The acid resist is then removed with a suitable solvent prior to the subsequent diffusion step. Alternatively, standard photolithographic techniques using commercially available photoresists may be employed.

A conductivity modifier capable of inducing in the semiconductor conductivity of a type opposite to that of the wafer 10 is now diffused into those portions of wafer face 11 which are exposed by openings 13 and 14. In this example, since wafer 10 consists of P type silicon, the conductivity modifier used is a donor such as arsenic, antimony, phosphorus, or the like. The donor-diffused regions 15 and 16 thus formed immediately adjacent wafer face 11 are converted to N type conductivity, and are of low resistivity. The diffusion is accomplished under such conditions of impurity source concentration and heating profile that the concentration of charge carriers (electrons in this example) at the surface of diffused regions 15 and 16 is at least $10^{19}$ per $cm.^2$. This concentration decreases with increasing depth into the wafer, and the donor-diffused regions 15 and 16 are less than one mil thick in this example. The size and shape of the donor-diffused regions 15 and 16 correspond generally to the size and shape of openings 13 and 14 respectively. PN junctions 17 and 18 respectively are formed at the boundaries or interface between the N type donor-diffused regions 15 and 16 respectively and the P type bulk of silicon wafer 10.

Figure 3:
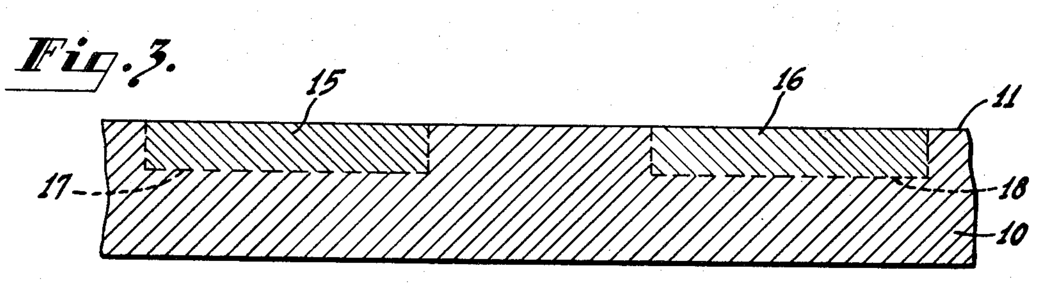

The silicon oxide layer 12 is now removed by treating the wafer 10 in an aqueous hydrofluoric acid solution, leaving the wafer 10 as illustrated in FIGURE 3.

Figure 4:
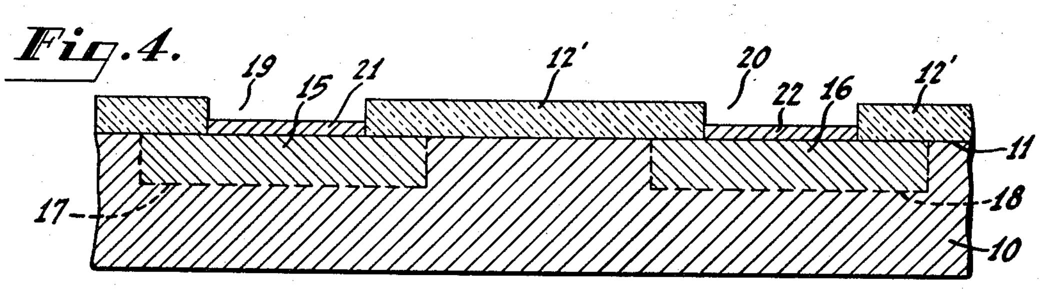

Referring now to FIGURE 4, an insulating coating or layer consisting of a fresh clean silicon oxide layer 12' is deposited on wafer face 11. When the wafer 10 consists of silicon, as in this example, the silicon oxide layer 12' may be formed by heating the wafer 10 in steam as previously described. Alternatively, the silicon oxide coating 12' may be deposited by the method described in U.S. Patent 3,114,663, issued on Dec. 17, 1963, to J. Klerer. The latter method may be utilized with any crystalline semiconductor.

Using standard masking and etching methods, such as the photolithographic technique, a pair of spaced openings 19 and 20 (FIGURE 4) are formed in silicon oxide coating 12', thus uncovering predetermined portions of wafer face 11. The exact size and shape of openings 19 and 20 are not critical, but one opening 19 is completely within one diffused region 15, and the other opening 20 is completely within the other diffused region 16.

A thin layer of either nickel or cobalt is now deposited on the exposed portions of wafer face 11 within openings 19 and 20 to form two layers 21 and 22 in contact with diffused regions 15 and 16 respectively. Layers 21 and 22 are preferably about 1500 to 2000 Angstroms thick, and may be deposited by any convenient method, such as sputtering, evaporation, or plating.

In this example, layers 21 and 22 consist of nickel, and are deposited by electroless plating. The wafer 10 is immersed for about 15 seconds in an aqueous electroless plating solution maintained at a temperature of about 80° to 85° C. Suitably, the aqueous plating solution consists of: nickel chloride [$NiCl_2 \cdot 6H_2O$]—30 grams per liter; ammonium chloride [$NH_4Cl$]—50 grams per liter; sodium citrate [$NaC_6H_5O_7 \cdot 2H_2O$]—100 grams per liter; sodium hypophosphite [$Na_2H_2PO_2 \cdot H_2O$]—10 grams per liter.

The pH of the resulting solution is adjusted to be within the range 8.0 to 10.0 by adding a solution of ammonium hydroxide. Under these conditions, a thin layer of nickel is deposited on the uncovered portions of wafer face 11 within openings 19 and 20, but is not deposited on the surface of silicon oxide layer 12'. The wafer is then heated in a nitrogen ambient for about 10 minutes at 570° C. to sinter the nickel layers 21 and 22, thus improving their adherence to wafer face 11.

The wafer 10 is now preferably treated for five minutes in a 50% aqueous hydrochloric acid solution maintained at 70° C. in order to clean up any impurities of the oxides on the surface of nickel layers 21 and 22, then rinsed in water. Wafer 10 is again immersed in the electroless plating solution described above for about 20 seconds, thus increasing the thickness of nickel layers 21 and 22.

Figure 5:
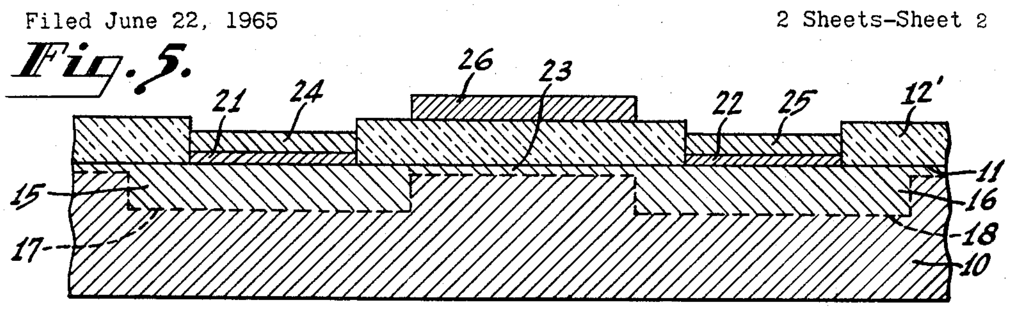

The wafer 10 is next heated in a hydrogen ambient for about 10 minutes at about 370° C. An N type conductive channel 23 (FIGURE 5) is thus formed in wafer 10 immediately adjacent wafer face 11. The conductive channel 23 connects the two N type diffused regions 15 and 16.

Aluminum coatings 24 and 25 (FIGURE 5) are deposited by any convenient method on the nickel layers 21 and 22 respectively. In this example, the aluminum coatings 24 and 25 are deposited by evaporation of a thin layer of aluminum over the entire surface of the wafer, including the silicon oxide layer 12'. The undesired portions of the aluminum are then removed by standard photolithographic methods. Suitably, the aluminum coatings 24 and 25 are about 0.5 mil thick. At the same time that the aluminum coatings 24 and 25 are deposited on nickel layers 21 and 22 respectively, another aluminum electrode 26 is deposited on the portion of silicon oxide layer 12' between the two diffused regions 15 and 16. The aluminum coatings 24 and 25 adhere well to the nickel layers 21 and 22, so that no further heating of wafer 10 is required for this purpose.

Figure 6:
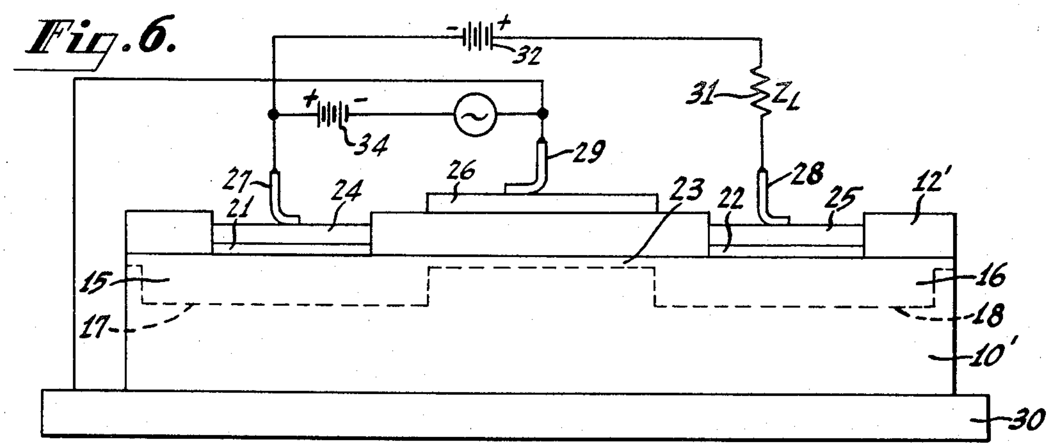
FIGURE 6 is a cross-sectional view of a completed device according to the said one embodiment.

The wafer 10 is cut to form a plurality of dies, each die 10' (FIGURE 6) including two diffused regions 15 and 16, with their associated nickel-aluminum electrodes 21, 24 and 22, 25 respectively. Lead wires 27, 28 and 29 are connected to aluminum layers 24, 25 and 26 respectively by any convenient method, such as by thermocompression bonding, or by ultrasonic welding. Each die 10' is mounted on a metallic header 30 with its major face 11 up, i.e., opposite the header. The remaining steps of encapsulating and sealing the unit are accomplished by standard methods of the art.

The device of this example may be operated as follows. Leads 27 and 28 are the source and drain leads respectively, while lead 29 is the control or gate lead. The load impedance $Z_L$, shown as a resistance 31, together with a source of direct current potential, such as a battery 32, are connected in series between the source lead 27 and the drain lead 28, so that the source region 15 is poled negative relative to the drain region 16. The header 30 is electrically connected to the gate lead 29. A source 33 of signal potential, and a second source of direct current potential, such as a battery 34, are connected in series between the control lead 29 and the source lead 27 so that the source lead 27 is biased positive relative to the gate lead 29.

In some prior art devices, silver is used as one of the metals which form the source and drain electrodes. Although satisfactory devices have been made in this manner, the silver has a tendency to migrate through the other metals present in the electrode, and also migrates through the silicon oxide, thus causing a gate leak when the device is given a life test at elevated temperatures.

Field effect devices which have a conductive channel, such as the device of this example, generally exhibit a decrease in the conductivity of the channel when the device is stored at elevated temperatures. This decline in channel conductivity results in a decrease of the source-drain current at zero gate bias.

Figure 7:
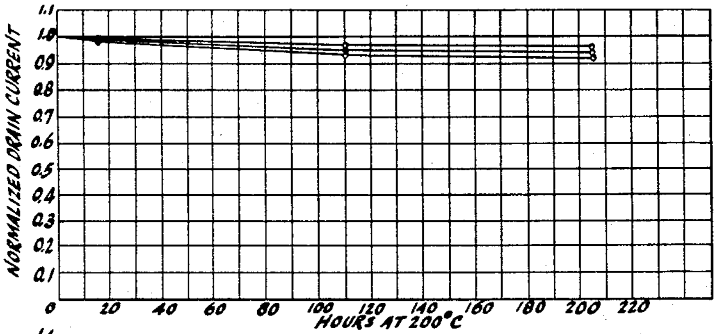
FIGURE 7 is a plot showing the variation of the normalized drain current with time for three of the improved devices (FIGURE 6) maintained at 200° C.; and, FIGURE 8 is a plot showing the variation of the normalized drain current with time for three comparable prior are devices maintained at 200° C.

FIGURE 7 is a plot showing the variation with time of the normalized source-drain current at zero gate bias for three insulated-gate field-effect devices fabricated according to the above embodiment and maintained at 200° C. It will be noted that after 200 hours at 200° C., the drain current for all three devices according to this embodiment is still more than 90% of the original value. In fact, the average value of the drain current of the three devices, after 200 hours storage at 200° C., is about 95% of the original value.

Figure 8:
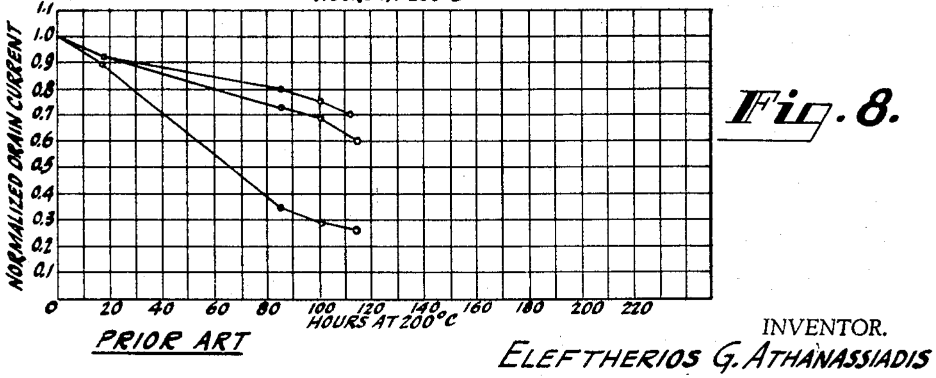
PRIOR ART Fig. 8.

In contrast, the source-drain current at zero gate bias for three comparable prior art insulated-gate field-effect devices with chrome silver electrodes (FIGURE 8) has decreased to less than 80% of the original value after only 100 hours storage at 200° C. Furthermore, all three prior art units failed due to a gate short before they achieved 120 hours of operation.

In other prior art devices all three electrodes consist of aluminum. While this avoids the migration problems associated with silver, it has been found that aluminum does not make a good ohmic contact to silicon unless it is alloyed into the silicon at about 600° C. Such high temperature alloying has an undesirable side effect. The aluminum gate electrode 26 tends to diffuse through the silicon oxide layer 12′ when the device is heated to 600° C., thus causing a gate leak. The latter problem can be avoided by first depositing aluminum electrodes on the source and drain regions of the devices, alloying the aforesaid source and drain electrodes to the wafer at 600° C., and then depositing the aluminum gate electrode in a subsequent and separate step. However, such a procedure increases both the production time and production cost per unit. Other metals have been utilized to form device electrodes, but each has drawbacks. For example, gold is difficult to etch by standard photolithographic techniques, and does not adhere well to silicon oxide. Chromium electrodes are very hard, and are covered by an oxide film, so that it is difficult to bond electrical lead wires to chromium electrodes.

EXAMPLE II

In the first example, the semiconductive wafer utilized consisted of silicon. In the embodiment now described, the semiconductive body 10 (FIGURE 1) consists of a given conductivity type monocrystalline silicon-germanium alloy, such as described in U.S. Patent 2,997,410, issued to Be. Selikson on Aug. 22, 1961.

Figure 2:
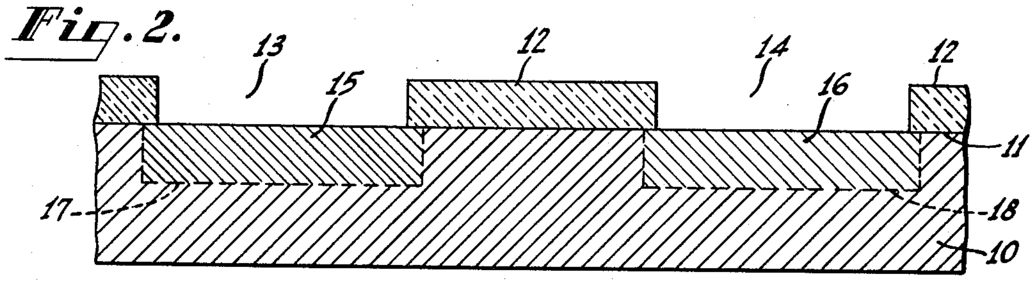

The first steps in the fabrication of a semiconductor device according to this example are conducted as described in Example I above in connection with FIGURES 1–3. In this example, metal layers 21 and 22 (FIGURE 4) deposited through openings 19 and 20 on major face 11 of semiconductive wafer 10 consist of cobalt. Cobalt layers 21 and 22 may be deposited by evaporation. Alternatively, the cobalt layers 21 and 22 may be deposited by electroless plating, using a solution similar to that described in Example I, but with cobalt chloride instead of nickel chloride. The remaining steps of forming a conductive channel 23, depositing aluminum coatings 24 and 25 (FIGURE 5) on the cobalt layers 21 and 22 respectively, depositing an aluminum electrode 26 on the insulating silicon oxide layer 12′, then cutting semiconductive wafer 10 into a plurality of dies, each die 10′ (FIGURE 6) having three electrical lead wires 27, 28 and 29 bonded to aluminum layers 24, 25 and 26 respectively, are similar to those described in Example I above.

The above examples are by way of illustration only, and not limitation. Although the invention has been described for convenience in terms of a depletion type MOS transistor, it will be appreciated that electrodes can similarly be fabricated on enhancement type MOS transistors, as well as to other insulated-gate field-effect transistors, and to other solid state devices having a crystalline semiconductive body. Other crystalline semiconductors may be utilized, and the metallic electrodes may be deposited thereon by other methods, such as sputtering.

Various other modifications may be made by those skilled in the art without departing from the spirit and scope of the invention as described in the specification and appended claims.

What is claimed is:

1. An insulated-gate field-effect transistor comprising:
a given conductivity type crystalline semiconductive body having at least one major face;
first and second spaced opposite conductivity type regions in said body adjacent said one major face;
an insulating coating on said one major face except said first and second spaced regions;
first and second contacts on said first and second regions respectively, each said contact comprising a first layer consisting of either nickel or cobalt on said major face over each of said first and second regions, and a second layer consisting of aluminum over each said first layer;
a metallic electrode on said insulating coating over the space between said first and second regions;
a first electrical lead wire bonded to said aluminum layer over said first region;
a second electrical lead wire bonded to said aluminum layer over said second region; and,
a third electrical lead wire bonded to said metallic electrode on said insulating coating.

2. An insulated-gate field-effect transistor comprising:
a given conductivity type monocrystalline silicon body having at least one major face;
first and second spaced opposite conductivity type regions in said body adjacent said one major face;
an insulating coating over said one major face except over said first and second spaced regions;
first and second contacts on said first and second regions respectively, each said contact comprising a layer of nickel on said one major face over each of said first and second regions, and a layer of aluminum over each said nickel layer;
a metallic electrode on said insulating coating over the space between said first and second regions;
a first electrical lead wire bonded to said aluminum layer over said first region;
a second electrical lead wire bonded to said aluminum layer over said second region; and,
a third electrical lead wire bonded to said metallic electrode on said insulating coating.

References Cited

UNITED STATES PATENTS

| | | | |
|---|---|---|---|
| 2,962,394 | 11/1960 | Andres | 117—213 |
| 3,219,890 | 11/1965 | Levi-Lamond | 317—234 |
| 3,231,421 | 1/1966 | Schmidt | 117—212 |
| 3,241,931 | 3/1966 | Triggs et al. | 29—195 |
| 3,334,281 | 8/1967 | Ditrick | 317—235 |

JOHN W. HUCKERT, *Primary Examiner.*

R. F. POLISSACK, *Assistant Examiner.*